US010553981B2

United States Patent
Tian et al.

(10) Patent No.: US 10,553,981 B2
(45) Date of Patent: Feb. 4, 2020

(54) ELECTRICAL CONNECTOR WITH FASTENING NUT SUPPORTABLY HELD BY METALLIC SHELL

(71) Applicant: FOXCONN INTERCONNECT TECHNOLOGY LIMITED, Grand Cayman (KY)

(72) Inventors: Xiao-Xian Tian, Kunshan (CN); Wei Zhong, Kunshan (CN); Jian-Kuang Zhu, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/104,546

(22) Filed: Aug. 17, 2018

(65) Prior Publication Data
US 2019/0058278 A1   Feb. 21, 2019

(30) Foreign Application Priority Data
Aug. 17, 2017 (CN) ..................... 2017 2 1034221 U

(51) Int. Cl.
*H01R 13/506* (2006.01)
*H01R 12/71* (2011.01)
*H01R 13/74* (2006.01)

(52) U.S. Cl.
CPC ......... *H01R 13/506* (2013.01); *H01R 12/716* (2013.01); *H01R 13/748* (2013.01)

(58) Field of Classification Search
CPC .. H01R 13/506; H01R 12/716; H01R 13/658; H01R 13/6581; H01R 24/60; H01R 13/73; H01R 13/748

USPC ......... 439/660, 607.01, 607.05, 607.53, 571, 439/573
See application file for complete search history.

(56) References Cited

U.S. PATENT DOCUMENTS

| 5,125,853 | A | * | 6/1992 | Hashiguchi | ........ H01R 12/7047 439/607.26 |
| 5,228,873 | A | * | 7/1993 | Hirai | ................... H01R 12/7023 439/607.4 |
| 5,249,983 | A | * | 10/1993 | Hirai | ................... H01R 12/7023 439/573 |
| 6,935,895 | B2 | * | 8/2005 | Fan | ..................... H01R 12/7011 439/607.31 |

(Continued)

FOREIGN PATENT DOCUMENTS

CN          2520047 Y    11/2002

*Primary Examiner* — Travis S Chambers
(74) *Attorney, Agent, or Firm* — Wei Te Chung; Ming Chieh Chang

(57) ABSTRACT

An electrical connector including an insulative housing having an elongated base and a pair of end sections each with opposite top and bottom surfaces, opposite front and rear surfaces. The shell includes a base plate covering the top surface at two opposite end sections of the base. Each end sections further includes a receiving cavity for receiving the retaining piece, and a slit communicatively beside the receiving cavity. The shell includes a pair of fixing tabs located at two opposite ends and respectively extending into the slits so as to interfere with the corresponding fastening nut for reliably positioning the fastening nut in the receiving cavity and being adapted to absorb the forces applied upon the fastening nut.

20 Claims, 6 Drawing Sheets

(56) References Cited

U.S. PATENT DOCUMENTS

| | | | | |
|---|---|---|---|---|
| 7,249,972 B2* | 7/2007 | Ohki | ................... | H01R 13/621 |
| | | | | 439/607.54 |
| 2015/0155651 A1* | 6/2015 | Ejiri | ................... | H01R 13/5213 |
| | | | | 439/521 |

* cited by examiner

ELECTRICAL CONNECTOR WITH FASTENING NUT SUPPORTABLY HELD BY METALLIC SHELL

FIELD OF THE INVENTION

The invention relates to the electrical connector assembly, particularly to the electrical connector equipped with the fastening nut supportably held by the metallic shell.

DESCRIPTION OF RELATED ART

The China Utility Patent No. CN2520047U discloses an electrical connector including an insulative housing enclosed within a metallic shell with a metallic fastening nut received within a cavity of the insulative housing and held by a spring tang extending from the metallic shell. Anyhow, the spring tang lacks sufficient support, thus failing to absorbing most the forces applied upon the nut during fastening by the screw. Therefore, the nut may tend to damage the insulative housing during fastening the electrical connector to other parts, e.g., the PCB, by the screw.

It is desired to have the electrical connector equipped with the fastening nut reliably held by the metallic shell absorbing most forces applied thereon.

SUMMARY OF THE INVENTION

An electrical connector including an insulative housing, a plurality of contacts retained in the housing, and a pair of retaining pieces received in the housing, an a metallic shell enclosing the housing. The housing includes an elongated base and a pair of end sections each with opposite top and bottom surfaces, opposite front and rear surfaces. The shell includes a base plate covering the top surface at two opposite end sections of the base. Each end sections further includes a receiving cavity for receiving the retaining piece, and a slit communicatively beside the receiving cavity. The shell includes a pair of fixing tabs located at two opposite ends and respectively extending into the slits so as to interfere with the corresponding fastening nut for reliably positioning the fastening nut in the receiving cavity and being adapted to absorb the forces applied upon the fastening nut.

Other objects, advantages and novel features of the invention will become more apparent from the following detailed description when taken in conjunction with the accompanying drawings.

DETAILED DESCRIPTION OF THE PREFERRED EMBODIMENT

Figure 1:
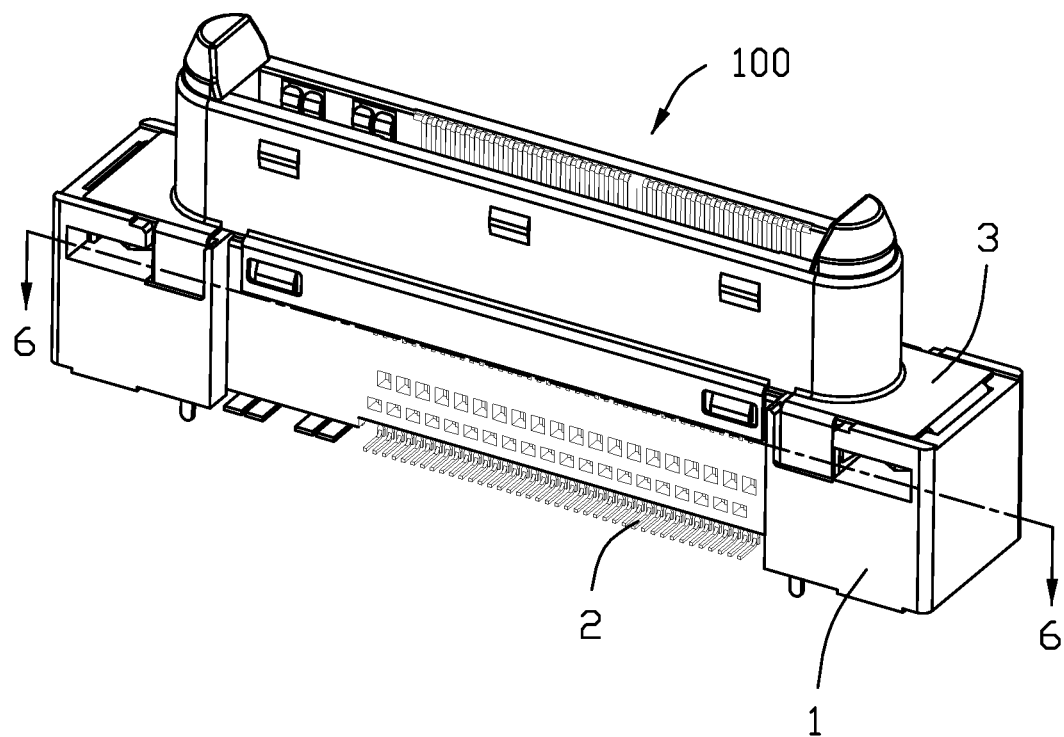
FIG. 1 is a perspective view of an electrical connector according to the invention.
Figure 2:
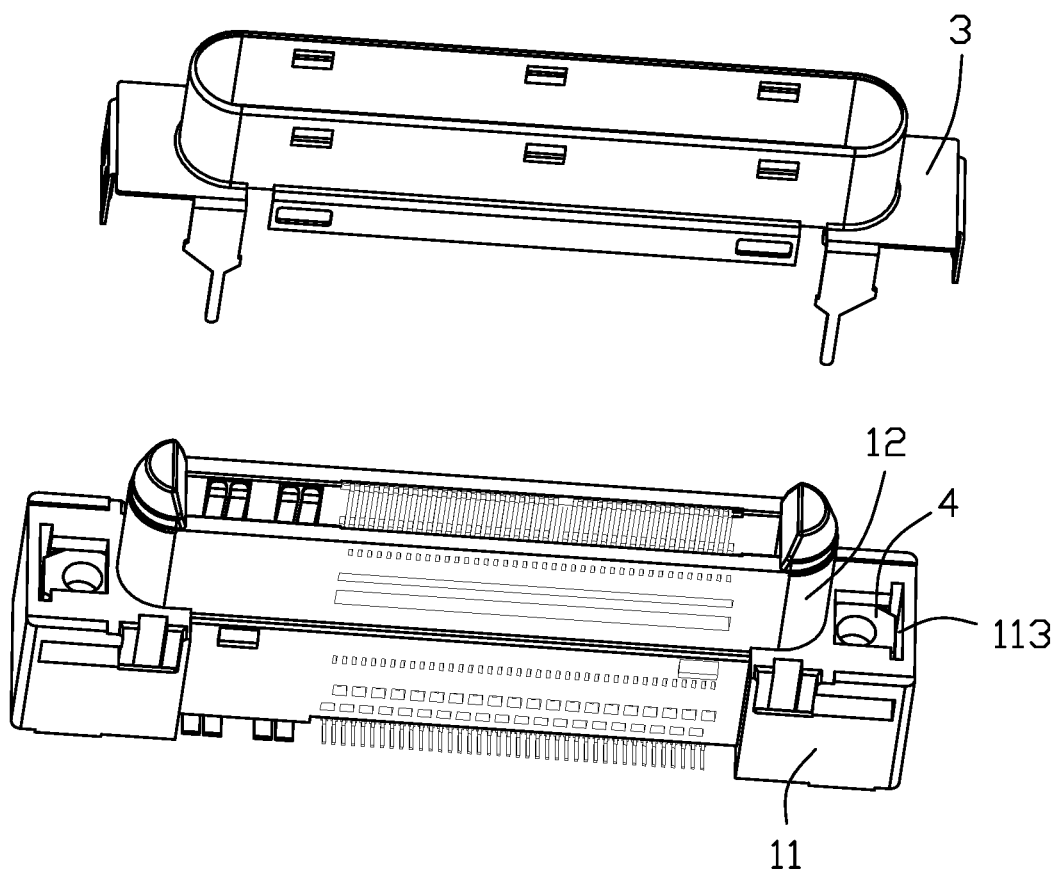
FIG. 2 is an exploded perspective view of the electrical connector of FIG. 1.
Figure 3:
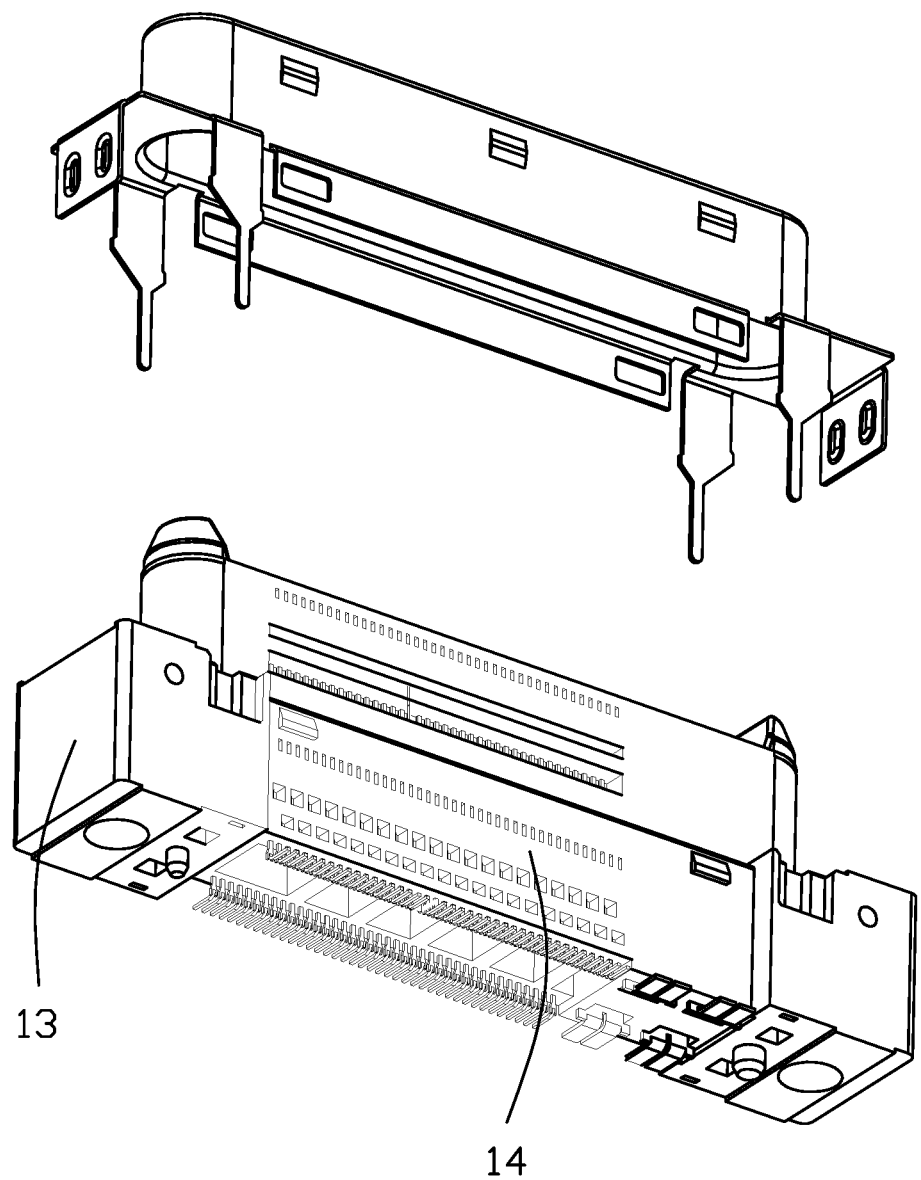
FIG. 3 is another exploded perspective view of the electrical connector of FIG. 2.
Figure 4:
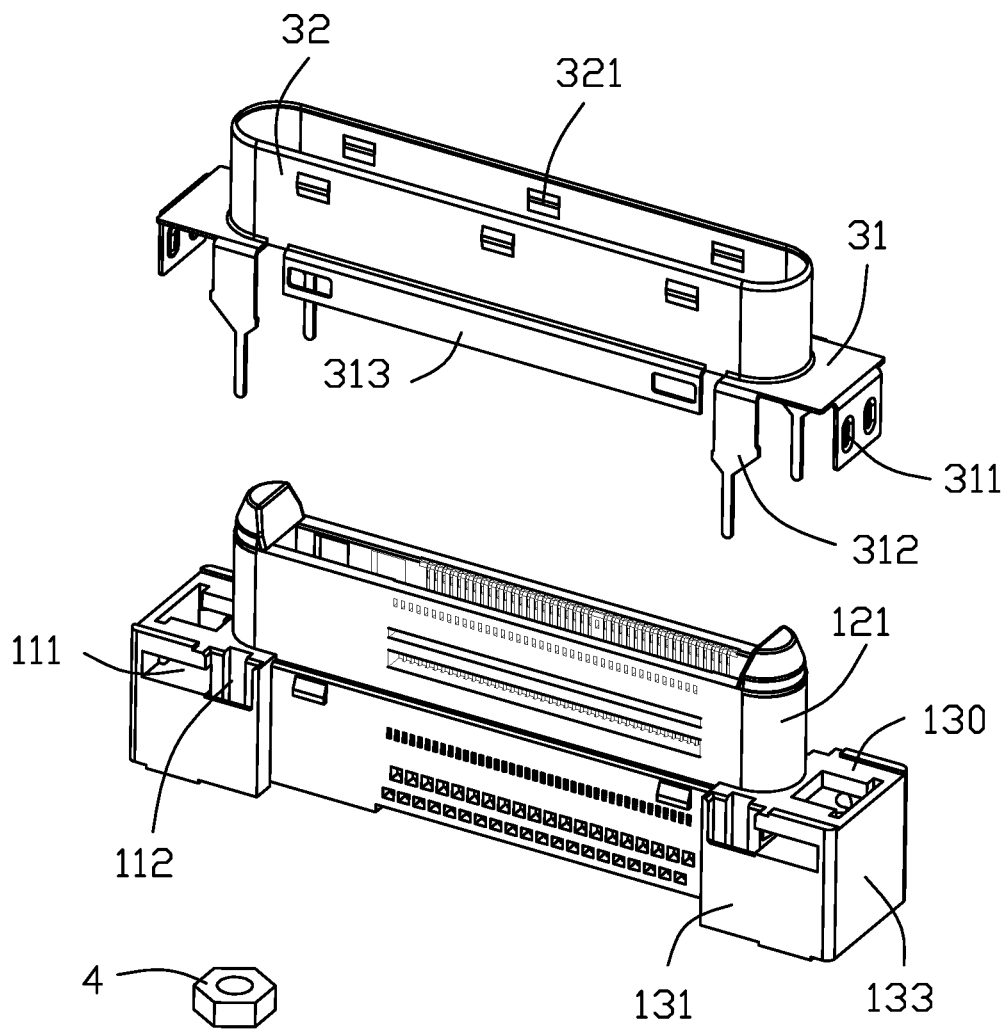
FIG. 4 is a further exploded perspective view of the electrical connector of FIG. 2.
Figure 4:
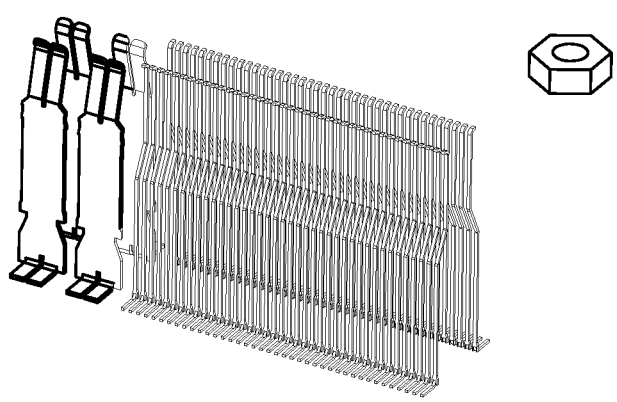
Figure 5:
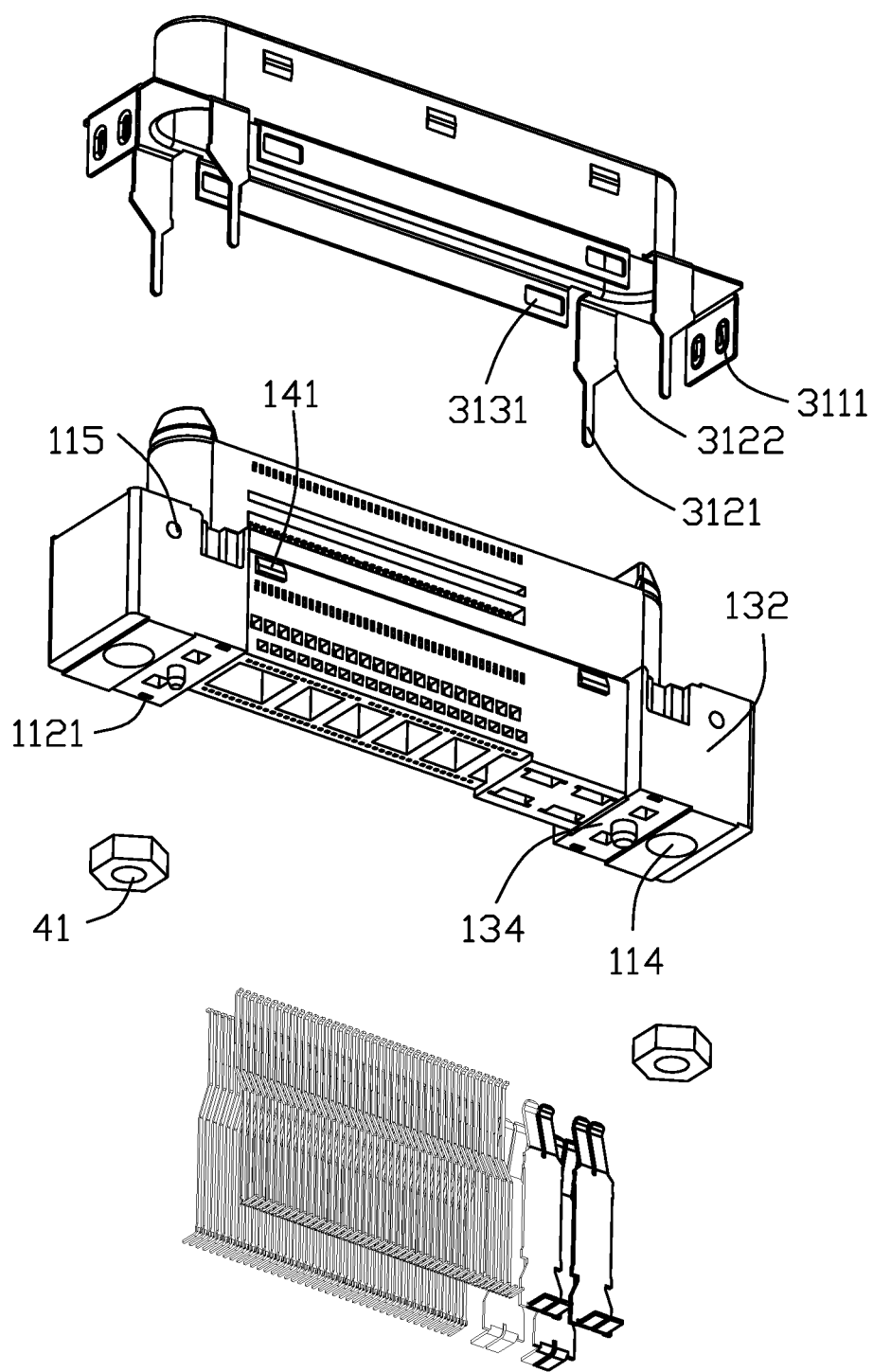
FIG. 5 is another further exploded perspective view of the electrical connector of FIG. 1.
Figure 6:
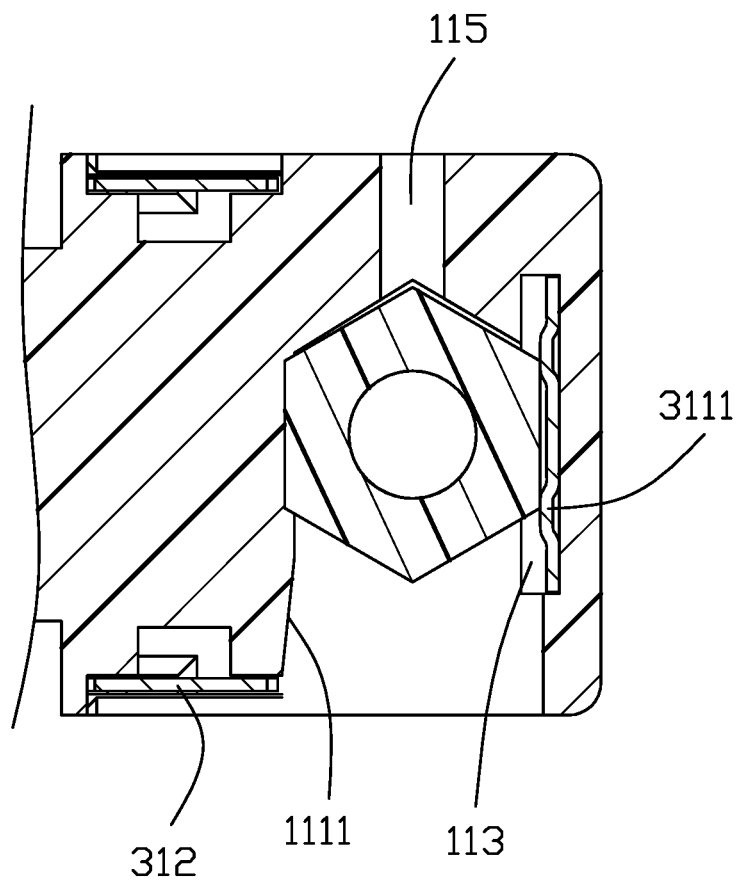
FIG. 6 is an enlarged cross-sectional view of a portion of the electrical connector of FIG. 1.

Referring to FIGS. 1-6, an electrical connector 100 includes an insulative housing 1, a plurality of contacts 2 retained in the housing 1, and a metallic shell enclosing housing 1.

The housing 1 includes an elongated base 11 and a mating section 12 extending upwardly from the base 11. The base 11 includes a main body 14 and a pair of end sections 13 at two opposite ends of the main body 14. The end section 13 forms a top face 130, opposite front face 131 and rear face 132, an end face 133 linking the front face 131 and the rear face 132, and a bottom face 134 opposite to the top face 130. Each end section 13 includes a receiving cavity 111 extending through the top face 130 and the bottom face 134 in the vertical direction, and also through the front face 131 and the rear face in a front-to-back direction with an opening in the front face for insertion of the corresponding fastening nut 4 illustrated later. An oblique guiding surface 1111 is formed in the receiving cavity 111 from the opening. The end section 13 further includes a pair of through slots 112 extending through the top face 130 and the bottom face 134 with a bottom opening 1121. The end section 13 further includes a slit 113 extending downwardly through the top face 130 and communicating with the receiving cavity 111 in a lengthwise direction perpendicular to both the vertical direction and the front-to-back direction. Notably, in a top view, the dimension of the slit 113 in the front-to-back direction is larger than that of receiving cavity 111 in the front-to-back direction while the dimension of the slit 113 in the lengthwise direction is smaller than that of the receiving cavity 111 in the lengthwise direction. The end section 13 further includes an opening 114 in the bottom face 134 to upwardly communicate with the receiving cavity 111. The mating section 12 forms a plurality of contact passageways to receive the corresponding contacts 2 therein. The mating section 12 forms a pair of semi-columns at two opposite ends for mating with the complementary connector (not shown).

The metallic shell 13 includes a base 31 covering the top face 130 of each end section 13, and a collar 32 extending upwardly from the base 31 to cover the mating section 12. The base 31 includes a pair of deformable fixing tabs 311 downwardly extending from two opposite ends of the base 31 and into the corresponding slits 113. In fact, the fixing tabs forms a pair of bosses 3111. Two pairs of the mounting legs 312 extending downwardly from opposite side edges of the base 31 and into the corresponding through slots 112 with the soldering ends 3121 extending beyond the bottom face 134. Each mounting leg 312 has barbs 3122 interfering within the through slot 112. The shell 3 further includes a pair of extensions 313 between two corresponding mounting legs 312 in the lengthwise direction with securing holes 3131 therein for engagement with the corresponding blocks 141 on the main body 14. The collar 32 unitarily forms a plurality of locking pieces 321, either protrusions or recesses, for engagement with the complementary connector (not shown) during mating.

A pair of fastening nuts 4 with corresponding through holes 41 therein are received within the corresponding receiving cavities 111, respectively. The fastening nut 4 cooperates with the opening 114 and the receiving cavity 111 to allow the corresponding screw (not shown) to extend therethrough in the vertical direction. Notably, when the metallic shell 3 is assembled upon the housing 1, the fastening nut 4 is forcibly inserted rearwardly into the receiving cavity 111 via the guiding surface 1111 from the corresponding opening in the front face 131 along the front-to-back direction until the fastening nut 4 is stopped by the interior surface of the housing 1 in the receiving slot 111. The outer side of the fastening nut 4 is pressed by the corresponding fixing tab 311 in the lengthwise direction. An ejection hole 115 is formed in the end section 13 to communicate with the receiving cavity 111 and the fastening nut 4 therein so as to be adapted to eject the fastening nut 4 forwardly out of the receiving cavity 111 in the front-to-back direction if the fastening nut 4 is required to be replaced. Understandably, the fixing tab 311 does not prohibit forcible insertion or ejection of the corresponding fastening nut 4 with regard to the receiving cavity 111.

Compared with the traditional design, the fastening nut interferes with the housing in the receiving cavity on both opposite sides of the fastening nut in the lengthwise direction wherein the outer/end side of the housing may confront a potential damage due to the relatively thin structure thereof. In the invention, the metallic fixing tab 311 substitutes to confront/engage the fastening nut 4, thus avoiding the potential damage advantageously. Notably, the receiving cavity 111 is configured and dimensioned to restrict the fastening nut 4 from moving in the vertical direction so the fastening nut 4 is required to be inserted thereinto along the horizontal direction, e.g., the front-to-back direction. Compared with the aforementioned traditional design, the fastening nut can be replaceable without removing the metallic shell conveniently. In addition, in this embodiment, there are two spaced bosses 3111 formed on the fixing tab 311, and the engagement side of the six sides of the hexagon nut is located therebetween in the front-to-back direction for reliable positioning It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the members in which the appended claims are expressed.

What is claimed is:

1. An electrical connector comprising:
an insulative housing including an elongated base with a main body and two opposite end sections at two opposite ends of the main body in a lengthwise direction;
each of the end sections forming a receiving cavity therein;
each of said end sections defining opposite top face and bottom face in a vertical direction perpendicular to the lengthwise direction, and opposite front face and rear face in a front-to-back direction perpendicular to both the lengthwise direction and the vertical direction;
a metallic shell attached upon the housing and including a base to cover the top face of each of said end sections, a pair of fixing tabs extending downwardly from two opposite ends of the base of said metallic shell; and
a pair of fastening nuts snugly received within the corresponding receiving cavities, respectively; wherein
each of said fixing tabs confronts and engages the corresponding fastening nut inwardly;
wherein
each of receiving cavities forms an opening in a corresponding face for forcible insertion of the corresponding fastening nut thereinto when the shell is assembled upon the housing, and the fixing tab does not prohibit forcible insertion or rejection of the corresponding fastening tab with regard to the corresponding receiving cavity.

2. The electrical connector as claimed in claim 1, wherein each fixing tabs forms a boss preventing forward movement of the corresponding fastening nut in the front-to-back direction.

3. The electrical connector as claimed in claim 1, wherein a pair of bosses are formed on each of the fixing tabs, and an engagement side of the fastening nut is essentially engaged between therebetween in the front-to-back direction.

4. The electrical connector as claimed in claim 1, wherein each of said fastening nuts interferes with the housing and the corresponding fixing tab in the lengthwise direction.

5. The electrical connector as claimed in claim 1, wherein the receiving cavity is configured and dimension to snugly receive the corresponding fastening nut in both the vertical direction and the lengthwise direction.

6. The electrical connector as claimed in claim 1, wherein in each of the end sections an ejection hole is formed in the rear face to communicate with the corresponding receiving cavity so as to forwardly eject the corresponding fastening nut out of the receiving cavity via the opening in the front face in the front-to-back direction.

7. The electrical connector as claimed in claim 6, wherein the shell does not block the opening in the front face.

8. The electrical connector as claimed in claim 1, wherein each of said end sections forms a slit to receive the corresponding fixing tab.

9. The electrical connector as claimed in claim 8, wherein said slit communicate with the corresponding receiving cavity in the lengthwise direction.

10. The electrical connector as claimed in claim 9, wherein in the front-to-back direction a dimension of the slit is larger than that of the receiving cavity while in the lengthwise direction a dimension of the slit is smaller than that of the receiving cavity.

11. The electrical connector as claimed in claim 1, wherein each of the fastening nuts is assembled into the corresponding receiving cavity along the front-to-back direction while each of the fixing tabs confronts the corresponding fastening nut in the lengthwise direction.

12. The electrical connector as claimed in claim 11, wherein each of the fastening nuts forms a through hole extending along the vertical direction.

13. An electrical connector comprising:
an insulative housing including an elongated base with a main body and two opposite end sections at two opposite ends of the main body in a lengthwise direction;
each of the end sections forming a receiving cavity therein;
each of said end sections defining opposite top face and bottom face in a vertical direction perpendicular to the lengthwise direction, and opposite front face and rear face in a front-to-back direction perpendicular to both the lengthwise direction and the vertical direction;
a metallic shell attached upon the housing and including a base to cover the top face of each of said end sections, a pair of fixing tabs extending downwardly from two opposite ends of the base of said metallic shell in the vertical direction; and
a pair of fastening nuts snugly received within the corresponding receiving cavities and engaged with the corresponding fixing tab along the lengthwise direction, respectively; wherein
in each of the end sections, an opening is formed in the front face to allow the corresponding fastening nut to be rearwardly inserted into the corresponding receiving cavity in the front-to-back direction via said opening; wherein
the shell not only does not block or cover the opening in the front face but also does not block or cover the corresponding receiving cavity so as to allow the corresponding fastening nut to be rearwardly inserted forcibly into the corresponding receiving cavity via said opening when the shell is assembled upon the housing.

14. The electrical connector as claimed in claim 13, wherein each of said end sections forms an opening in the rear face to communicate with corresponding receiving cavity so as to forwardly eject the corresponding fastening nut out of the receiving cavity via the opening in the front face when the shell is assembled upon the housing.

15. The electrical connector as claimed in claim 13, wherein an engagement between the fastening nut and the corresponding fixing tab occurs in the lengthwise direction.

16. The electrical connector as claimed in claim 13, wherein in each of said end sections the fixing tab is located on an outer side of the corresponding fastening nut in the lengthwise direction.

17. An electrical connector comprising:
an insulative housing including an elongated base with a main body and two opposite end sections at two opposite ends of the main body in a lengthwise direction;
each of the end sections forming a receiving cavity therein;
each of said end sections defining opposite top face and bottom face in a vertical direction perpendicular to the lengthwise direction, and opposite front face and rear face in a front-to-back direction perpendicular to both the lengthwise direction and the vertical direction;
a metallic shell attached upon the housing and including a base to cover the top face of each of said enc sections,
a pair of fixing tabs extending downwardly from two opposite ends of the base of said metallic shell; and
a pair of fastening nuts snugly received within the corresponding receiving cavities, respectively; wherein
each of said fixing tabs has a pair of bosses, and an engagement side of the corresponding fastening nut is located therebetween;
wherein
each of the fixing tabs confronts the corresponding fastening nut in the lengthwise direction; wherein
each of the fastening nuts forms a through hole extending along the vertical direction while the engagement side of the corresponding fastening nut is located between the pair of bosses of the corresponding fixing tab in the front-to-back direction.

18. The electrical connector as claimed in claim 17, wherein said fastening nut is hexagon, and the engagement side of said fastening nut is at an outer side.

19. The electrical connector as claimed in claim 17, wherein each of said end sections forms a slit communicatively beside the corresponding receiving cavity to receive the corresponding fixing tab, and in the front-to-back direction a dimension of the slit is larger than that of the receiving cavity while in the lengthwise direction a dimension of the slit is smaller than that of the receiving cavity.

20. The electrical connector as claimed in claim 17, wherein an opening is formed in the front face to communicate with the corresponding receiving cavity in the front-to-back direction for allowing to have the corresponding fastening nut to be rearwradly inserted into the receiving cavity in the front-to-back direction.

\* \* \* \* \*